(12) United States Patent
Kang et al.

(10) Patent No.: US 9,599,663 B2
(45) Date of Patent: Mar. 21, 2017

(54) PROBING METHOD, PROBE CARD FOR PERFORMING THE METHOD, AND PROBING APPARATUS INCLUDING THE PROBE CARD

(71) Applicant: SAMSUNG ELECTRONICS CO., LTD., Suwon-si, Gyeonggi-do (KR)

(72) Inventors: Sang-Boo Kang, Suwon-si (KR); Ki-Sub Lim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 688 days.

(21) Appl. No.: 14/085,945

(22) Filed: Nov. 21, 2013

(65) Prior Publication Data

US 2014/0253154 A1   Sep. 11, 2014

(30) Foreign Application Priority Data

Mar. 8, 2013   (KR) .................. 10-2013-0024747

(51) Int. Cl.
   *G01R 21/00*   (2006.01)
   *G01R 31/28*   (2006.01)

(52) U.S. Cl.
   CPC ..... *G01R 31/2874* (2013.01); *G01R 31/2889* (2013.01)

(58) Field of Classification Search
   CPC .................. G01R 31/2874; G01R 31/2889
   See application file for complete search history.

(56) References Cited

U.S. PATENT DOCUMENTS

| | | | |
|---|---|---|---|
| 7,332,918 B2 | 2/2008 | Sugiyama et al. | |
| 7,405,584 B2 | 7/2008 | Fujita et al. | |
| 7,456,641 B2 | 11/2008 | Bae et al. | |
| 7,642,794 B2 | 1/2010 | Eldridge et al. | |
| 2007/0262782 A1* | 11/2007 | Hartmann | G01R 31/2891 324/750.22 |
| 2008/0136436 A1 | 6/2008 | Hong | |
| 2008/0186040 A1* | 8/2008 | Hobbs | G01R 31/2863 324/750.28 |
| 2010/0207653 A1 | 8/2010 | Yang et al. | |
| 2012/0062259 A1 | 3/2012 | Yamada et al. | |

FOREIGN PATENT DOCUMENTS

| | | |
|---|---|---|
| JP | 06-41140 U | 5/1994 |
| JP | 2006-173206 A | 6/2006 |
| JP | 2006-186130 A | 7/2006 |
| JP | 2007-227444 A | 9/2007 |
| JP | 2008-286666 A | 11/2008 |
| KR | 10-2008-0024002 A | 3/2008 |
| KR | 10-1007939 B1 | 1/2011 |
| KR | 10-1015484 B1 | 2/2011 |
| KR | 10-2012-0028282 A | 3/2012 |

\* cited by examiner

*Primary Examiner* — Daniel Miller
(74) *Attorney, Agent, or Firm* — Lee & Morse P.C.

(57) ABSTRACT

A probe method includes setting an allowable temperature range, the allowable temperature range including a test temperature and ensuring contact between a pad of a circuit substrate and a needle of a probe card, providing the probe card with a temperature within the allowable temperature range, contacting the needle of the probe card to the pad of the circuit substrate, and supplying a test current to the pad through the needle to test the circuit substrate.

20 Claims, 4 Drawing Sheets

PROBING METHOD, PROBE CARD FOR PERFORMING THE METHOD, AND PROBING APPARATUS INCLUDING THE PROBE CARD

CROSS-REFERENCE TO RELATED APPLICATION

Korean Patent Application No. 10-2013-0024747, filed on Mar. 8, 2013, in the Korean Intellectual Property Office, and entitled: "Probing Method, Probe Card for Performing the Method, and Probing Apparatus Including the Probe Card," is incorporated by reference herein in its entirety.

BACKGROUND

1. Field

Example embodiments relate to a probing method, a probe card for performing the method, and probing apparatus including the probe card. More particularly, example embodiments relate to a probing method of testing electrical characteristics of a semiconductor substrate using needles, a probe card for performing the method, and probing apparatus for testing the semiconductor substrate using the probe card.

2. Description of the Related Art

Generally, a probe card may be used for testing a semiconductor substrate. The probe card may include a multi-layered substrate having a test pattern, and a plurality of needles provided to the multi-layered substrate to make contact with pads of the semiconductor substrate. A test current generated from a tester may be transmitted to the semiconductor substrate through the test pattern and the needles to test electrical characteristics of the semiconductor substrate. The semiconductor substrate may be tested at a high temperature and at a low temperature. Thus, the high temperature and the low temperature may be selectively provided to a test chamber in which the semiconductor substrate may be placed.

Because the semiconductor substrate and the multi-layered substrate of the probe card may have different thermal strains, the needles may not accurately make contact with the pads of the semiconductor substrate. In order to prevent loss of contact between the needles and the pads, an additional process may be required for providing the multi-layered substrate of the probe card with the test temperature of the semiconductor substrate.

SUMMARY

Example embodiments provide a probe method capable of curtailing a time for providing a multi-layered substrate with a test temperature.

Example embodiments also provide a probe card for performing a probe method capable of curtailing a time for providing a multi-layered substrate with a test temperature.

Example embodiments also provide a probing apparatus including a probe card for performing a probe method capable of curtailing a time for providing a multi-layered substrate with a test temperature.

According to example embodiments, there is provided a probing method including setting an allowable temperature range, the allowable temperature range ensuring contact between a pad of a circuit substrate and a needle of a probe card, a test temperature of the circuit substrate being in the allowable temperature range, providing the probe card with a temperature within the allowable temperature range, contacting the needle of the probe card to the pad of the circuit substrate, and supplying a test current to the pad through the needle to test the circuit substrate, the circuit substrate being at the test temperature.

Providing the probe card with the allowable temperature range may include contacting the needle to a dummy substrate, and supplying the allowable temperature range to the needle through the dummy substrate.

The test temperature may be a high temperature, and the allowable temperature range includes a lowermost temperature lower than the high temperature.

The test temperature may be a low temperature, and the allowable temperature range includes an uppermost temperature higher than the low temperature.

Setting the allowable temperature range may include setting a first temperature as a first limit of the allowable temperature range, the first temperature being a lowermost temperature or an uppermost temperature at which the needle of the probe card maintains contact with the pad of the circuit substrate, and setting the test temperature of the circuit substrate as a second limit of the allowable temperature range, the allowable temperature range being defined between the first and second limits.

Providing the probe card with a temperature within the allowable temperature range may include heating or cooling the probe card only until it reaches the lowermost temperature or the uppermost temperature, respectively, and the lowermost temperature is lower than the high test temperature, and the uppermost temperature is higher than the high test temperature.

Setting the first temperature may include setting the first limit as the lowermost temperature, and setting the test temperature may include setting the second limit as a high test temperature, the lowermost temperature being lower than the high test temperature.

Providing the probe card with a temperature within the allowable temperature range may include heating the probe card only until it reaches the lowermost temperature.

Setting the first temperature may include setting the first limit as the uppermost temperature, and setting the test temperature includes setting the second limit as a low test temperature, the uppermost temperature being higher than the high test temperature.

Providing the probe card with a temperature within the allowable temperature range may include cooling the probe card only until it reaches the uppermost temperature.

According to example embodiments, there is also provided a probe card including a multi-layered substrate having a test pattern, a test current being configured to pass through the test pattern during a test, a plurality of needles on the multi-layered substrate and electrically connected between the test pattern of the multi-layered substrate and a pad of a circuit substrate, the test current being supplied to the circuit substrate through the needles, and a temperature-controlling unit on the multi-layered substrate, the temperature-controlling unit being configured to provide the multi-layered substrate with an allowable temperature range for ensuring contact between the pad of the circuit substrate having a test temperature and the needles.

The temperature controlling unit may include a sensor attached to the multi-layered substrate, the sensor being configured to sense temperature of the multi-layered substrate, and a sensor circuit board on the multi-layered substrate, the sensor circuit board being configured to process temperature data of the multi-layered substrate sensed by the sensor.

The sensor may include a plurality of sensing members arranged around a center point of the multi-layered substrate.

The sensing members may be spaced apart from each other by a uniform interval.

The sensing members may be attached to an upper surface and a lower surface of the multi-layered substrate.

The probe card may further include a stiffner configured to support the multi-layered substrate, and a printed circuit board (PCB) interposed between the stiffner and the multi-layered substrate.

According to example embodiments, there is also provided a probing apparatus, including a probe card having a multi-layered substrate having a test pattern, a test current being configured to pass through the test pattern during a test, a plurality of needles on the multi-layered substrate and electrically connected between the test pattern of the multi-layered substrate and a pad of a circuit substrate, the test current being supplied to the circuit substrate through the needles, and a temperature-controlling unit on the multi-layered substrate, the temperature-controlling unit being configured to provide the multi-layered substrate with an allowable temperature range for ensuring contact between the pad of the circuit substrate having a test temperature and the needles, a tester configured to generate the test current, the allowable temperature range being set in the tester, and a test head electrically connected between the tester and the circuit substrate.

The probing apparatus may further include a chuck configured to support the circuit substrate, and a temperature-providing member in the chuck and configured to provide the circuit substrate with the test temperature, the temperature-providing member being controlled by the temperature-controlling unit to provide the multi-layered substrate with the allowable temperature range.

BRIEF DESCRIPTION OF THE DRAWINGS

Example embodiments will be more clearly understood from the following detailed description taken in conjunction with the accompanying drawings.

FIG. 1 illustrates a cross-sectional view of a probing apparatus in accordance with example embodiments;

FIG. 2 illustrates a plan view of a probe card in FIG. 1;

FIG. 3 illustrates a cross-sectional view of operations for providing a probe card with an allowable temperature range in accordance with example embodiments;

FIG. 4 illustrates a flow chart of stages in a method of probing a substrate at a high temperature using the probing apparatus in FIG. 1; and FIG. 5 illustrates a flow chart of stages in a method of probing a substrate at a low temperature using the probing apparatus in FIG. 1.

DETAILED DESCRIPTION

Figure 1:
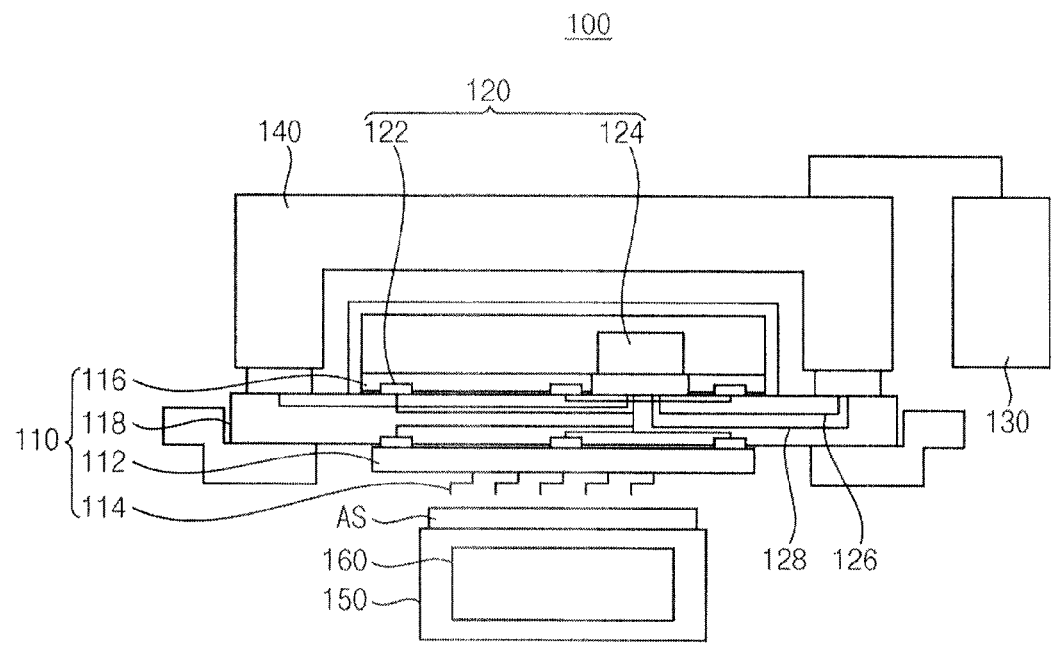
FIGS. 1 to 5 represent non-limiting, example embodiments as described herein.

Various example embodiments will be described more fully hereinafter with reference to the accompanying drawings, in which some example embodiments are shown. Example embodiments may, however, be embodied in many different forms and should not be construed as limited to those set forth herein. Rather, the example embodiments are provided so that this disclosure will be thorough and complete, and will fully convey the scope of the exemplary implementations to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Probing Apparatus

Figure 2:
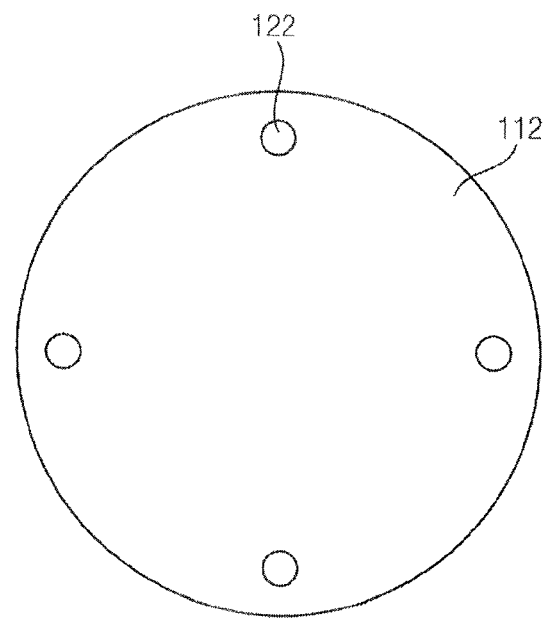
Figure 3:
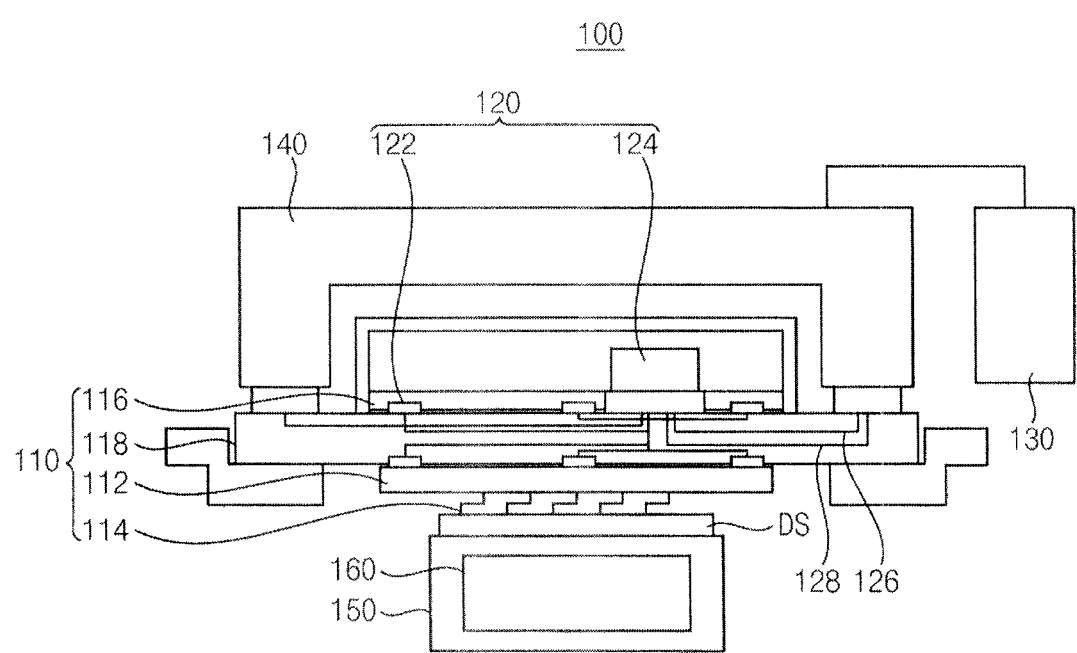

FIG. 1 illustrates a cross-sectional view of a probing apparatus in accordance with example embodiments, FIG. 2 illustrates a plan view of a probe card in FIG. 1, and FIG. 3 illustrates a cross-sectional view of operations for providing the probe card in FIG. 1 with an allowable temperature range.

Referring to FIG. 1, a probing apparatus 100 according to example embodiments may include a probe card 110, a temperature-controlling unit 120, a tester 130, a test head 140, a chuck 150, and a temperature-providing member 160.

The probe card 110 may include a multi-layered substrate 112, a plurality of needles 114, a stiffner 116, and a printed circuit board (PCB) 118. The probe card 110 may electrically contact a circuit substrate AS to test electrical characteristics of the circuit substrate AS.

The multi-layered substrate 112 may include sequentially stacked insulating substrates. In example embodiments, the insulating substrates may include ceramic substrates. Test patterns (not shown) may be formed in the multi-layered substrate 112. A test current for testing the circuit substrate AS may pass through the test patterns. In example embodiments, the circuit substrate AS may include a semiconductor substrate.

The needles 114 may be installed on a lower surface of the multi-layered substrate 112. The needles 114 may be electrically connected to the test patterns in the multi-layered substrate 112. The needles 114 may electrically contact pads of the circuit substrate AS. Thus, the test current may be supplied to the circuit substrate AS through the test patterns and the needles 114.

The stiffner 116 may be arranged over the multi-layered substrate 112. The stiffner 116 may be configured to support the multi-layered substrate 112.

The PCB 118 may be interposed between the stiffner 116 and the multi-layered substrate 112. The PCB 118 may include a test circuit (not shown) through which the test current may pass. Thus, the test circuit in the PCB 118 may be electrically connected to the test patterns in the multi-layered substrate 112.

The temperature-controlling unit 120 may control a temperature of the probe card 110. In example embodiments, the temperature-controlling unit 120 may provide the probe card 110 with an allowable temperature range. The allowable temperature range may correspond to a temperature range for allowing a contact between the needles 114 and the pads of the circuit substrate AS.

For example, when the circuit substrate AS is tested at a high temperature, the temperature-providing unit 160 may heat the circuit substrate AS and the probe card 110 to the high temperature, i.e., to the high test temperature. In another example, when the circuit substrate AS is tested at a high temperature, the temperature-providing unit 160 may heat the circuit substrate AS only to a lowest temperature, at which proper contact between the needles 114 and the circuit substrate AS is guaranteed.

In detail, the high temperature test may be performed at the high temperature only by contacting the needles 114 with the pads of the circuit substrate AS, e.g., as long as the needles 114 maintain proper electrical contact with the pads of the circuit substrate AS. Thus, it may not be required necessarily to heat the probe card 110 to the high temperature, i.e., to the high test temperature. Therefore, a lowermost temperature, e.g., lower than the high test temperature, at which proper contact between the needles 114 and the pads of the circuit substrate AS is ensured, may be determined. Accordingly, a temperature range from the lowermost temperature to the high test temperature is determined as an allowable temperature range for the high temperature testing of the probe card 110.

Similarly, when the circuit substrate AS is tested at a low temperature, the temperature-providing unit 160 may cool the circuit substrate AS to the low temperature, i.e., to the lower test temperature. In another example, when the circuit substrate AS is tested at a low temperature, the temperature-providing unit 160 may cool the circuit substrate AS only to an uppermost temperature, at which proper contact between the needles 114 and the circuit substrate AS is guaranteed.

In detail, the low temperature test may be performed at the low temperature only by contacting the needles 114 with the pads of the circuit substrate AS, e.g., as long as the needles 114 maintain proper electrical contact with the pads of the circuit substrate AS. Thus, it may not be required necessarily to cool the probe card 110 to the low temperature, i.e., to the low test temperature. Therefore, an uppermost temperature, e.g., higher than the low test temperature, at which proper contact between the needles 114 and the pads is ensured, may be determined. Accordingly, a temperature range from the under the uppermost temperature to the low test temperature may be determined as an allowable temperature range for the low temperature testing of the probe card 110.

In example embodiments, the temperature-controlling unit 120 may include a sensor 122 and a sensor circuit board 124. Referring to FIGS. 1 and 2, the sensor 122 may include a plurality of sensing members arranged on the multi-layered substrate 112, e.g., on an upper surface and a lower surface of the multi-layered substrate 112. The sensing members of the sensor 122 may be arranged equidistantly around a center point of the multi-layered substrate 112, and may be spaced apart from each other by a uniform interval. For example, as illustrated in FIG. 2, the sensing members of the sensor 122 may be arranged at constant intervals along a perimeter of the multi-layered substrate 112. The sensor 122 including the sensing members may measure temperatures of entire regions on the multi-layered substrate 112, e.g., each sensing member of the sensor 122 may measure a temperature at a corresponding region of the multi-layered substrate 112 to provide temperatures of all the regions in the multi-layered substrate 112.

The sensor circuit board 124 may be arranged on the upper surface of the multi-layered substrate 112. The sensor circuit board 124 may process data including the temperatures of the multi-layered substrate 112 sensed by the sensor 122. In example embodiments, the sensor circuit board 124 may be connected to the tester 130 through input/output channels 126 and sensing channels 128. The input/output channels 126 and the sensing channels 128 may be formed in the multi-layered substrate 112.

The tester 130 may generate the test current for testing the circuit substrate AS. The tester 130 may be electrically connected with the sensor circuit board 124 through the input/output channels 126 and the sensing channels 128. The allowable temperature range may be set in the tester 130.

The test head 140 may be positioned over the probe card 110. The test head 140 may be electrically connected between the tester 130 and the probe card 110 to transmit the test current to the probe card 110.

The chuck 150 may be arranged under the probe card 110. The temperature-providing member 160 may be built in the chuck 150. The circuit substrate AS may be placed on an upper surface of the chuck 150. The temperature-providing member 160 may heat or cool the circuit substrate AS.

In example embodiments, as shown in FIG. 3, the test temperature may be provided to the circuit substrate AS and the probe card 110 using a dummy substrate DS. In detail, the dummy substrate DS may be positioned on the upper surface of the chuck 150, and the needles 114 may contact the dummy substrate DS. Next, the temperature-providing member 160 may heat or cool the dummy substrate DS to a desired temperature, e.g., lowest or uppermost temperature. Thus, the desired temperature, i.e., the heat or the coolness, may be transferred through the dummy substrate DS to the multi-layered substrate 112 and the needles 114 to provide the probe card 110 with a temperature within the allowable temperature range.

Probing Method

Figure 4:
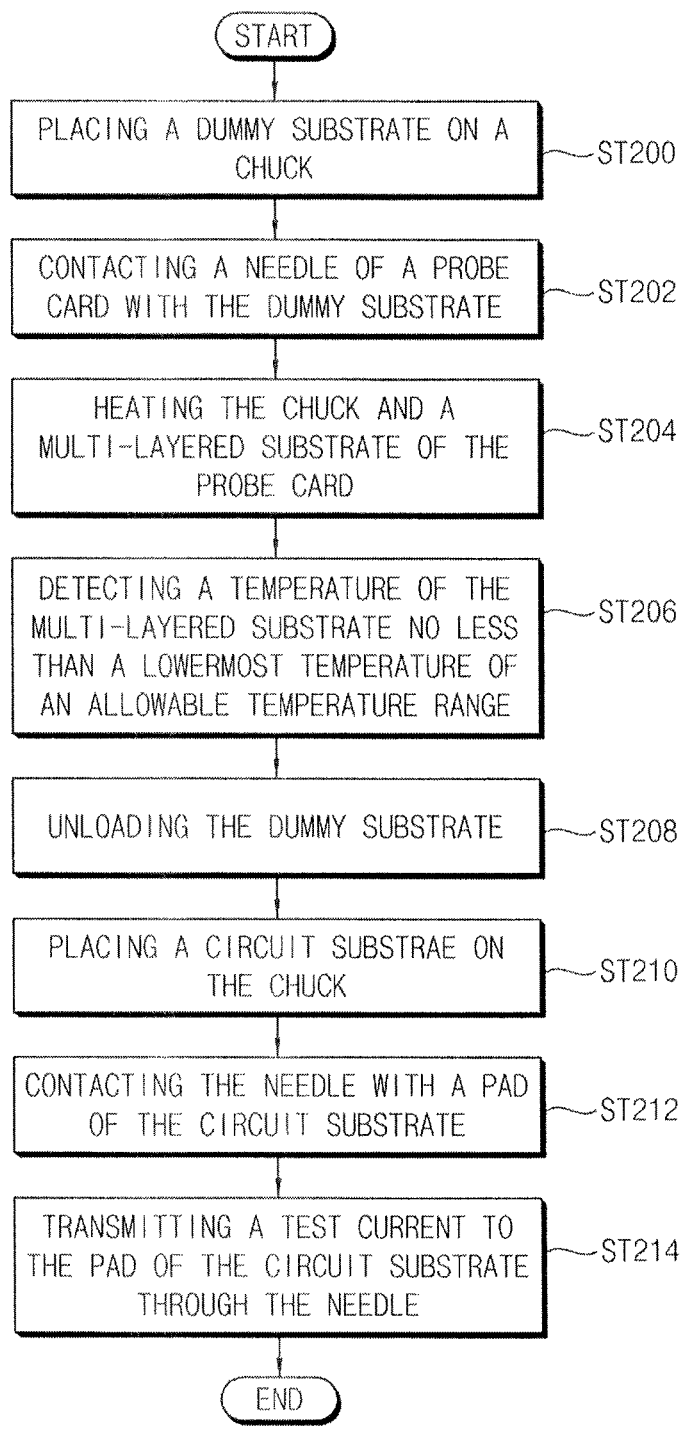

FIG. 4 illustrates a flow chart of stages in a method of probing a substrate at a high temperature using the probing apparatus in FIG. 1.

Referring to FIGS. 1 and 4, in operation ST200, the dummy substrate DS may be placed on the upper surface of the chuck 150. Next, in operation ST202, the chuck 150 may be ascended to contact the dummy substrate DS with the needles 114 of the probe card 110.

In operation ST204, the temperature-providing member 160 may heat the chuck 150. Thus, the dummy substrate DS on the chuck 150 may also be heated. Further, the heat in the dummy substrate DS may be transferred to the multi-layered substrate 112 through the needles 114 to heat the multi-layered substrate 112.

In operation ST206, the sensor 122 may sense a temperature of the multi-layered substrate 112. The temperature of the multi-layered substrate 112 sensed by the sensor 122 may be transmitted to the tester 130 through the sensor circuit board 124.

When the tester 130 detects that the temperature of the multi-layered substrate 112 is not less than the lowermost temperature of the allowable temperature range set in the tester 130, the tester 130 may stop operation of the temperature-providing member 160. Thus, the temperature-providing member 160 may heat the multi-layered substrate 112 to the lowermost temperature of the allowable temperature range, rather than to the high temperature, i.e., to the testing temperature. Accordingly, as the temperature-providing member 160 heats the multi-layered substrate 112 to a temperature lower than the testing temperature, the time for heating the probe card 110 is substantially reduced.

In operation ST208, after the probe card 110 is heated to a desired temperature, i.e., to a temperature within the allowable temperature range, the dummy substrate DS may be unloaded from the chuck 150. Next, in operation ST210, the circuit substrate AS may be placed on the upper surface of the chuck 150.

In operation ST212, the chuck 150 may be ascended to contact the needles 114 of the probe card 110 with the pads of the circuit substrate AS. In example embodiments, the allowable temperature range may correspond to a temperature range for allowing a proper contact between the needles 114 and the pads of the circuit substrate AS. Thus, although the temperature of the probe card 110 may be lower than the high temperature, the needles 114 of the probe card 110 may make proper and accurate contact with the pads of the circuit substrate AS.

In operation ST214, the test current generated from the tester 130 may be transmitted to the probe card 110 through the test head 140. The test current may be transmitted to the pads of the circuit substrate AS through the needles 114 to test electrical characteristics of the circuit substrate AS at the high temperature.

Figure 5:
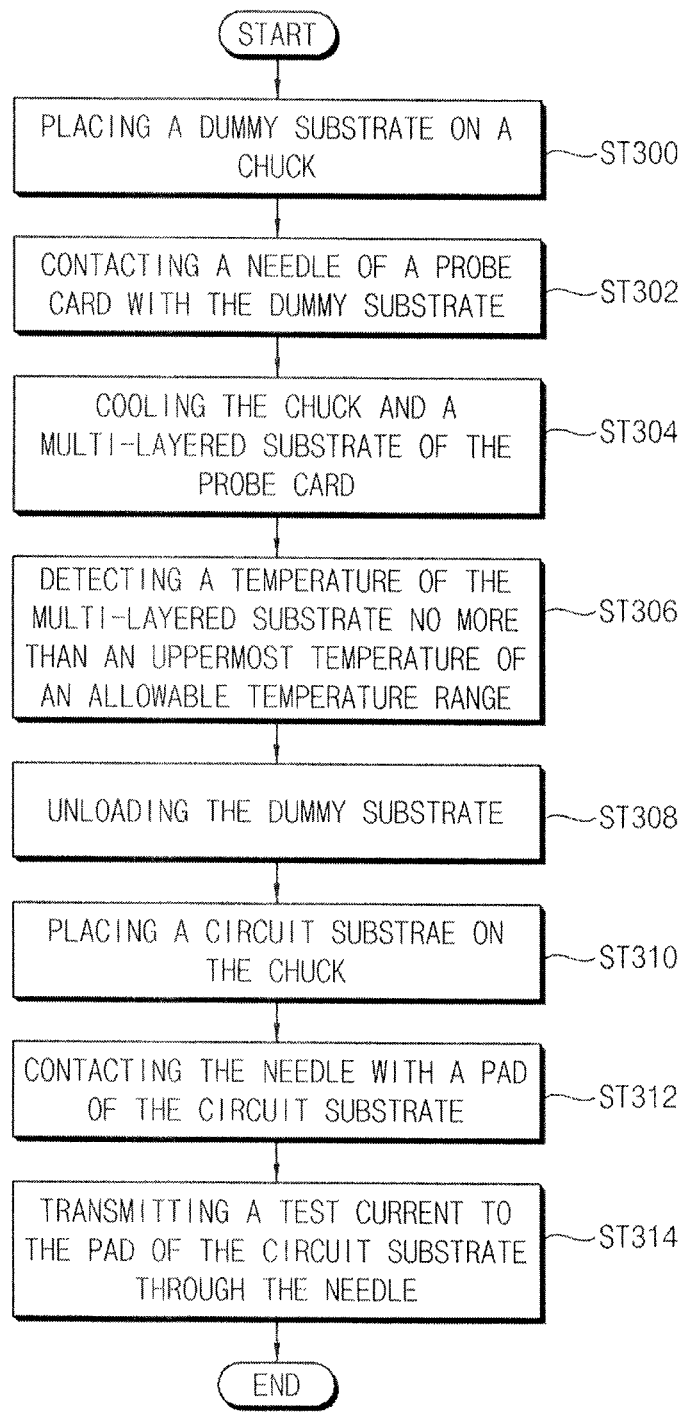

FIG. 5 illustrates a flow chart of stages in a method of probing a substrate at a low temperature using the probing apparatus in FIG. 1.

Referring to FIGS. 1 and 5, in operation ST300, the dummy substrate DS may be placed on the upper surface of the chuck 150. Next, in operation ST302, the chuck 150 may be ascended to contact the dummy substrate DS with the needles 114 of the probe card 110.

In operation ST304, the temperature-providing member 160 may cool the chuck 150. Thus, the dummy substrate DS on the chuck 150 may also be cooled. Further, the coolness in the dummy substrate DS may be transferred to the multi-layered substrate 112 through the needles 114 to cool the multi-layered substrate 112.

In operation ST306, the sensor 122 may sense a temperature of the multi-layered substrate 112. The temperature of the multi-layered substrate 112 sensed by the sensor 122 may be transmitted to the tester 130 through the sensor circuit board 124. When the tester 130 detects that the temperature of the multi-layered substrate 112 is equal to or lower than the uppermost temperature of the allowable temperature range set in the tester 130, the tester 130 may stop operations of the temperature-providing member 160. Thus, the temperature-providing member 160 may cool the multi-layered substrate 112 to the uppermost temperature of the allowable temperature range, rather than to the low temperature, i.e., to the test temperature. Accordingly, as the temperature-providing member 160 cools the multi-layered substrate 112 to a temperature higher than the testing temperature, the time for cooling the probe card 110 is substantially reduced.

In operation ST308, after the probe card 110 is at a temperature within the allowable temperature range, the dummy substrate DS may be unloaded. Next, in operation ST310, the circuit substrate AS may be placed on the upper surface of the chuck 150.

In operation ST312, the chuck 150 may be ascended to contact the needles 114 of the probe card 110 with the pads of the circuit substrate AS. In example embodiments, the allowable temperature range corresponds to a temperature range that allows proper contact between the needles 114 and the pads of the circuit substrate AS. Thus, although the temperature of the probe card 110 may be higher than the low temperature, the needles 114 of the probe card 110 may accurately make contact with the pads of the circuit substrate AS.

In operation ST314, the test current generated from the tester 130 may be transmitted to the probe card 110 through the test head 140. The test current may be transmitted to the pads of the circuit substrate AS through the needles 114 to test electrical characteristics of the circuit substrate AS at the low temperature.

According to example embodiments, the multi-layered substrate may be heated or cooled to an allowable temperature range, i.e., a range that ensures proper contact between the needles and the pad, rather than to the actual test temperature. Thus, as the time for the probe card to reach the lowest or highest limit of the temperature range is shorter than the time required to reach the test temperature, the cooling/heating time of the probe card may be curtailed. As a result, the time for testing the circuit substrate may also be remarkably shortened.

In contrast, in a conventional method, the time for providing the multi-layered substrate with the specific test temperature is calculated, followed by heating or cooling the multi-layered substrate for the duration of the calculated time. However, the calculated time may be too long, and the resultant test process may also be long.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, all such modifications are intended to be included within the scope of the present invention as defined in the appended claims.

What is claimed is:

1. A probe method, the method comprising:
setting an allowable temperature range, the allowable temperature range ensuring contact between a pad of a circuit substrate and a needle of a probe card, a test temperature of the circuit substrate being in the allowable temperature range;
providing the probe card with a probe temperature within the allowable temperature range, such that the probe card reaches the probe temperature before reaching the test temperature of the circuit substrate;
after the probe card reaches the probe temperature, contacting the needle of the probe card to the pad of the circuit substrate; and
supplying a test current to the pad through the needle to test the circuit substrate, the circuit substrate being at the test temperature.

2. The method as claimed in claim 1, wherein providing the probe card with the allowable temperature range includes:
contacting the needle to a dummy substrate; and
adjusting a temperature of the dummy substrate, such that the temperature of the dummy substrate is transferred to the probe card through the needle only until the probe card reaches the probe temperature.

3. The method as claimed in claim 1, wherein the test temperature is a first temperature, and the allowable temperature range includes a lowermost temperature lower than the first temperature.

4. The method as claimed in claim 1, wherein the test temperature is a second temperature, and the allowable temperature range includes an uppermost temperature higher than the second temperature.

5. The method as claimed in claim 1, wherein setting the allowable temperature range includes:
setting a first temperature as a first limit of the allowable temperature range, the first temperature being a lowermost temperature or an uppermost temperature at which the needle of the probe card maintains contact with the pad of the circuit substrate; and
setting the test temperature of the circuit substrate as a second limit of the allowable temperature range, the allowable temperature range being defined between the first and second limits.

6. The method as claimed in claim 5, wherein:
providing the probe card with the probe temperature includes heating or cooling the probe card only until it reaches the lowermost temperature or the uppermost temperature, respectively.

7. The method as claimed in claim 5, wherein setting the first temperature includes setting the first limit as the lowermost temperature, and setting the test temperature includes setting the second limit as a higher temperature than the lowermost temperature.

8. The method as claimed in claim 7, wherein providing the probe card with the probe temperature includes heating the probe card only until it reaches the lowermost temperature.

9. The method as claimed in claim 5, wherein setting the first temperature includes setting the first limit as the uppermost temperature, and setting the test temperature includes setting the second limit as a lower temperature than the uppermost temperature.

10. The method as claimed in claim 9, wherein providing the probe card with the probe temperature includes cooling the probe card only until it reaches the uppermost temperature.

11. A probe card, comprising:
a multi-layered substrate having a test pattern, a test current passing through the test pattern during a test;
a plurality of needles on the multi-layered substrate and electrically connected between the test pattern of the multi-layered substrate and a pad of a circuit substrate, the test current being supplied to the circuit substrate through the needles; and
a temperature-controlling unit on the multi-layered substrate to provide the multi-layered substrate with a probe temperature within an allowable temperature range, the allowable temperature range ensuring contact between the pad of the circuit substrate having a test temperature and the needles, such that the multi-layered substrate reaches the probe temperature before reaching the test temperature.

12. The probe card as claimed in claim 11, wherein the temperature controlling unit includes:
a sensor attached to the multi-layered substrate to sense temperature of the multi-layered substrate; and
a sensor circuit board on the multi-layered substrate to process temperature data of the multi-layered substrate sensed by the sensor.

13. The probe card as claimed in claim 12, wherein the sensor includes a plurality of sensing members arranged around a center point of the multi-layered substrate.

14. The probe card as claimed in claim 13, wherein the sensing members are spaced apart from each other by a uniform interval.

15. The probe card as claimed in claim 13, wherein the sensing members are attached to an upper surface and a lower surface of the multi-layered substrate.

16. The probe card as claimed in claim 11, further comprising:
a stiffener to support the multi-layered substrate; and
a printed circuit board (PCB) interposed between the stiffener and the multi-layered substrate.

17. A probing apparatus, comprising:
a probe card, including:
- a multi-layered substrate having a test pattern, a test current passing through the test pattern during a test,
- a plurality of needles on the multi-layered substrate and electrically connected between the test pattern of the multi-layered substrate and a pad of a circuit substrate, the test current being supplied to the circuit substrate through the needles, and
- a temperature-controlling unit on the multi-layered substrate to provide the multi-layered substrate with a probe temperature within an allowable temperature range, the allowable temperature range ensuring contact between the pad of the circuit substrate having a test temperature and the needles, such that the multi-layered substrate reaches the probe temperature before reaching the test temperature;

a tester to generate the test current, the allowable temperature range being set in the tester; and a test head electrically connected between the tester and the circuit substrate.

18. The probing apparatus as claimed in claim 17, further comprising:
- a chuck to support the circuit substrate; and
- a temperature-providing member in the chuck to provide the circuit substrate with the test temperature and the multi-layered substrate with the probe temperature.

19. The probing apparatus as claimed in claim 17, further comprising a temperature-providing member to adjust a temperature of the multi-layered substrate only until the multi-layered substrate reaches the probe temperature.

20. The probing apparatus as claimed in claim 11, wherein the temperature-controlling unit stops adjusting temperature of the multi-layered substrate as soon as the multi-layered substrate reaches the probe temperature.

* * * * *